(12) United States Patent
Hausler et al.

(10) Patent No.: US 10,015,899 B2
(45) Date of Patent: Jul. 3, 2018

(54) TERMINAL BLOCK WITH SEALED INTERCONNECT SYSTEM

(71) Applicant: Rosemount Inc., Shakopee, MN (US)

(72) Inventors: George Charles Hausler, Maple Grove, MN (US); Steven John McCoy, Eden Prairie, MN (US); Christopher Lee Eriksen, St. Paul, MN (US); Jeffrey Alan Cota, Rosemount, MN (US)

(73) Assignee: Rosemount Inc., Shakopee, MN (US)

( * ) Notice: Subject to any disclaimer, the term of this patent is extended or adjusted under 35 U.S.C. 154(b) by 211 days.

(21) Appl. No.: 14/753,119

(22) Filed: Jun. 29, 2015

(65) Prior Publication Data

US 2016/0381822 A1    Dec. 29, 2016

(51) Int. Cl.
| | |
|---|---|
| *H05K 5/00* | (2006.01) |
| *H05K 5/06* | (2006.01) |
| *G01D 11/24* | (2006.01) |
| *G01D 21/00* | (2006.01) |
| *H05K 7/14* | (2006.01) |

(52) U.S. Cl.
CPC ............. *H05K 5/069* (2013.01); *G01D 11/24* (2013.01); *G01D 21/00* (2013.01); *H05K 5/0065* (2013.01); *H05K 7/1428* (2013.01); *H05K 7/1432* (2013.01)

(58) Field of Classification Search
CPC .... H05K 5/069; H05K 5/0065; H05K 7/1428; H05K 7/1432; G01D 21/00; G01D 11/24
USPC .................. 361/728, 730, 752, 796
See application file for complete search history.

(56) References Cited

U.S. PATENT DOCUMENTS

| | | | |
|---|---|---|---|
| 3,247,719 A | 4/1966 | Chelner | 73/420 |
| 4,623,266 A | 11/1986 | Kielb | |
| 4,958,938 A | 9/1990 | Schwartz | 375/208 |
| 5,302,934 A | 4/1994 | Hart et al. | |
| 5,353,200 A | 10/1994 | Bodin et al. | 361/816 |
| 5,451,939 A | 9/1995 | Price | 340/870.31 |
| 5,483,743 A | 1/1996 | Armogan | 29/883 |
| 5,498,079 A | 3/1996 | Price | |

(Continued)

FOREIGN PATENT DOCUMENTS

| | | |
|---|---|---|
| CN | 2170506 Y | 6/1994 |
| CN | 20167398 Y | 6/1994 |

(Continued)

OTHER PUBLICATIONS

Office Action from Chinese Patent Application No. 201410054296.5, dated Dec. 29, 2016.

(Continued)

*Primary Examiner* — Hung S Bui
(74) *Attorney, Agent, or Firm* — Westman, Champlin & Koehler, P.A.

(57) ABSTRACT

A process variable transmitter for use in an industrial process includes a housing having a cavity formed therein. The housing has a barrier which divides the cavity into first and second cavities. Preferably, measurement circuitry in the first cavity is configured to measure a process variable of the industrial process. A terminal block assembly is positioned in the second cavity. The terminal block assembly forms a seal with the housing thereby forming a third cavity between the barrier and a circuit board of the terminal block assembly.

28 Claims, 10 Drawing Sheets

(56) References Cited

U.S. PATENT DOCUMENTS

| | | |
|---|---|---|
| 5,546,804 A | 8/1996 | Johnson et al. |
| 5,606,513 A | 2/1997 | Louwagie .................... 364/510 |
| 5,656,782 A | 8/1997 | Powell, II et al. ............. 73/756 |
| 5,665,899 A | 9/1997 | Willcox |
| 5,727,110 A | 3/1998 | Smith et al. |
| 5,753,797 A | 5/1998 | Forster et al. |
| 5,907,112 A | 5/1999 | Queyquep |
| 5,954,526 A | 9/1999 | Smith .......................... 439/136 |
| 5,983,619 A | 9/1999 | Dogre Cuevas ............. 374/141 |
| 6,062,095 A | 5/2000 | Mulrooney et al. ......... 73/866.5 |
| 6,146,188 A | 11/2000 | Snyder |
| 6,356,191 B1 | 3/2002 | Kirkpatrick et al. |
| 6,484,107 B1 | 11/2002 | Roper et al. .................... 702/50 |
| 6,546,805 B2 | 4/2003 | Fandrey et al. ................ 73/753 |
| 6,790,050 B1 | 9/2004 | Roth-Steielow et al. ... 439/76.2 |
| 7,164,262 B2 | 1/2007 | Zacay .......................... 324/115 |
| 7,190,053 B2 | 3/2007 | Orth et al. |
| 7,421,258 B2 | 9/2008 | Bauschke et al. ............ 455/128 |
| 7,550,826 B2 | 6/2009 | Orth et al. |
| 7,984,652 B2 | 7/2011 | Hausler ........................... 73/756 |
| 8,128,284 B2 | 3/2012 | Martensson .................. 374/208 |
| 8,217,782 B2 | 7/2012 | Nelson et al. ............. 340/539.1 |
| 8,223,478 B2 | 7/2012 | Perrault et al. |
| 8,290,721 B2 | 10/2012 | Wehrs et al. .................... 702/45 |
| 8,334,788 B2 | 12/2012 | Hausler et al. .......... 340/870.02 |
| 8,408,787 B2 | 4/2013 | Rud et al. |
| 8,736,784 B2 | 5/2014 | Hausler et al. ................. 349/58 |
| 9,030,190 B2 | 5/2015 | Matt ............................. 324/156 |
| 9,479,201 B2 | 10/2016 | Larson et al. |
| 9,907,563 B2 | 3/2018 | Germain et al. |
| 2002/0011115 A1 | 1/2002 | Frick ............................... 73/718 |
| 2002/0069700 A1 | 6/2002 | Dirmeyer ........................ 73/431 |
| 2002/0115333 A1* | 8/2002 | Self .................... H01R 13/6271 439/374 |
| 2004/0051521 A1 | 3/2004 | Ishihara .................... 324/207.16 |
| 2007/0191970 A1 | 8/2007 | Orth et al. |
| 2007/0201192 A1 | 8/2007 | McGuire et al. ............. 361/600 |
| 2009/0257722 A1 | 10/2009 | Fisher et al. |
| 2011/0058313 A1 | 3/2011 | Hausler et al. .......... 361/679.01 |
| 2011/0215944 A1 | 9/2011 | Hausler et al. |
| 2011/0317390 A1 | 12/2011 | Moser et al. ................. 361/807 |
| 2012/0063065 A1 | 3/2012 | Perrault et al. .......... 361/679.01 |
| 2013/0083824 A1 | 4/2013 | Bronczyk et al. |
| 2013/0126519 A1 | 5/2013 | Arnal Valero et al. |
| 2013/0344818 A1 | 12/2013 | McGuire et al. ................ 455/73 |
| 2014/0095095 A1 | 4/2014 | Rud et al. ........................ 702/69 |
| 2014/0269829 A1 | 9/2014 | Bronczyk et al. ............ 374/152 |
| 2015/0280754 A1* | 10/2015 | Larson ................. G01D 11/245 375/295 |
| 2016/0093997 A1 | 3/2016 | Eriksen et al. |
| 2016/0381822 A1 | 12/2016 | Hausler et al. |

FOREIGN PATENT DOCUMENTS

| | | |
|---|---|---|
| CN | 1155329 A | 7/1997 |
| CN | 1191602 | 8/1998 |
| CN | 1898534 A | 1/2007 |
| CN | 2857251 Y | 1/2007 |
| CN | 201204543 | 3/2009 |
| CN | 101776491 A | 7/2010 |
| CN | 102365528 | 2/2012 |
| CN | 102483366 | 5/2012 |
| CN | 202562633 U | 11/2012 |
| CN | 203053467 | 7/2013 |
| CN | 203148583 | 8/2013 |
| CN | 203 385 492 U | 1/2014 |
| CN | 204165564 | 2/2015 |
| CN | 204255566 | 4/2015 |
| CN | 205719038 | 11/2016 |
| DE | 10 2005 046 331 | 3/2007 |
| DE | 10 2010 030 924 | 12/2011 |
| EP | 1 897 365 | 10/2008 |
| EP | 2 772 729 A2 | 2/2014 |
| JP | S6448625 U | 3/1989 |
| JP | H0660919 A | 3/1994 |
| JP | H09-127066 | 5/1997 |
| JP | 2000509484 A | 7/2000 |
| JP | 2008-514012 | 5/2008 |
| JP | 4505662 B2 | 7/2010 |
| JP | 2011-146436 | 7/2011 |

OTHER PUBLICATIONS

Office Action from Japanese Patent Application No. 2016-518191, dated Mar. 8, 2017.
Communication from European Patent Application No. 13894160.4, dated Apr. 13, 2017.
Office Action from Russian Patent Application No. 2016116897, dated May 30, 2017.
Notification of Transmittal of the International Search Report and the Written Opinion of the International Searching Authority from PCT/US2016/035421, dated Sep. 21, 2016.
Invitation to Pay Additional Fee from corresponding International Patent Application No. PCT/US12/043705 dated May 24, 2013. 9 pgs.
Rosemount "Rosemount 3144P Temperature Transmitter," Mar. 2008.
Office Action from U.S. Appl. No. 13/251,726, dated Mar. 29, 2013.
Final Office Action from U.S. Appl. No. 13/251,726, dated Nov. 14, 2013.
Wika: "Digital Temperature Transmitter," Jul. 2008. 7 pgs.
Office Action from Chinese Patent Appln. No. 201120555381.1 dated Jun. 6, 2012. 3 pgs.
Product Data Sheet. Rosemount 644 Temperature Transmitter. Oct. 2010 by Emerson Process Management.28 pgs.
Bulletin IC50A0-E. Temperature Transmitters YTA Series. Yokogawa Electric Corporation. 8 pgs.
Product Data Sheet 3.80. TDZ&THZ Smart HART® Temperature Transmitters. Apr. 2005 by Moore Industries. 16 pgs.
Notification of Transmittal of the International Search Report and the Written Opinion of the International Searching Authority for PCT/US2012/043705, dated Apr. 23, 2014.
Office Action from U.S. Appl. No. 13/251,726, dated Apr. 24, 2014.
Office Action from Chinese Application No. 201110443913.7, dated Mar. 26, 2014.
Communication Under Rules 161(1) and 126 EPC from European Application No. 12743559.2, dated Jul. 4, 2014.
Office Action from Chinese Application No. 201110443913.7, dated Nov. 4, 2014.
Notification of Transmittal of the International Search Report and the Written Opinion of the International Searching Authority for PCT/US2014/049710, dated Oct. 28, 2014.
Notification of Transmittal of the International Search Report and the Written Opinion of the International Searching Authority for PCT/US2014/043123, dated Nov. 20, 2014.
Notification of Transmittal of the International Search Report and the Written Opinion of the International Searching Authority for PCT/CN2013/084662, dated Jun. 30, 2014.
Notification of Transmittal of the International Search Report and the Written Opinion of the International Searching Authority for PCT/US2015*014560, dated May 19, 2015.
Office Action from U.S. Appl. No. 14/225,775, dated Nov. 27, 2015.
Office Action from U.S. Appl. No. 14/225,775, dated Apr. 12, 2016.
Office Action from U.S. Appl. No. 14/237,476, dated May 31, 2016.
EP Communication from European Patent Application No. 138941604, dated May 9, 2016.
Office Action from U.S. Appl. No. 14/035,019, dated Jun. 21, 2016.
EP Communication from European Patent Application No. 14737130.6, dated May 4, 2016.
Office Action from Chinese Patent Application No. 201410054296.5, dated May 5, 2016.
Office Action from U.S. Appl. No. 14/036,787, dated Mar. 23, 2016.
Communication pursuant to Rules 161(1) and 162 EPC for European Patent Application No. 14755740.9-1568, dated May 4, 2016, 2 pages.
Office Action from Chinese Patent Application No. 201410186900.X, dated Oct. 19, 2016.

(56) References Cited

OTHER PUBLICATIONS

Office Action from U.S. Appl. No. 14/237,476, dated Dec. 29, 2016.
Office Action from U.S. Appl. No. 14/035,019, dated Jan. 5, 2017.
Office Action from Canadian Patent Application No. 2,923,141, dated Dec. 12, 2016.
Rosemount "Rosemount 3144P Temperature Transmitter," Nov. 2010.
Office Action from Japanese Patent Application No. 2016-544318, dated Apr. 19, 2017, 9 pages.
Office Action from U.S. Appl. No. 14/035,019, dated Sep. 24, 2013, 12 pages.
Third Office Action from Chinese Patent Application No. 201410054296.5, dated Jun. 20, 2017, 21 pages.
Communication pursuant to Rules 161(1) and 162 EPC for European Patent Application No. 16729166.5, dated Feb. 6, 2018, 3 pages.
Office Action from Chinese Patent Application No. 201510848995.1, dated Mar. 16, 2018.

* cited by examiner

TERMINAL BLOCK WITH SEALED INTERCONNECT SYSTEM

BACKGROUND

The present invention relates to industrial process control or monitoring systems. In particular, the present invention relates to process variable transmitters configured to sense process variables in such systems.

Process variable transmitters are used in industrial process control environments to monitor process variables. Such transmitters couple to a process fluid and provide measurements related to the process. Process variable transmitters can be configured to monitor one or more process variables associated with fluids in a process plant, such as slurries, liquids, vapors and gasses in chemical, pulp, petroleum, gas, pharmaceutical, food and other fluid processing plants. Example monitored process variables include pressure, temperature, flow, level, pH, conductivity, turbidity, density, concentration, chemical composition or other properties of fluids. Typically, the process variable transmitters are located at remote locations, usually in a field, and send information to a centralized location such as a control room. Process variable transmitters sense process variables in a variety of applications, including oil and gas refineries, chemical storage tank farms, or chemical processing plants. In many instances, this requires the process variable transmitters to be located in a harsh environment.

Some types of process variable transmitters include a housing divided into two separate compartments. One compartment contains electrical circuitry and the other compartment contains a terminal block used to couple to a process control loop. One such configuration is shown in U.S. Pat. No. 5,546,804.

SUMMARY

A process variable transmitter for use in an industrial process includes a housing having a cavity formed therein. The housing has a barrier which divides the cavity into first and second cavities. Preferably, measurement circuitry in the first cavity is configured to measure a process variable of the industrial process. A terminal block assembly is positioned in the second cavity. The terminal block assembly forms a seal with the housing thereby forming a third cavity between the barrier and a circuit board of the terminal block assembly.

This Summary and the Abstract are provided to introduce a selection of concepts in a simplified form that are further described below in the Detailed Description. The Summary and the Abstract are not intended to identify key features or essential features of the claimed subject matter, nor are they intended to be used as an aid in determining the scope of the claimed subject matter.

DETAILED DESCRIPTION OF ILLUSTRATIVE EMBODIMENTS

A process variable transmitter having a multi-compartment housing with a terminal block having a sealed compartment is provided. In one embodiment, a shroud member is sealed to a circuit board thereby eliminating the need for potting of the circuit board. The shroud member is sealed to the housing. This configuration allows a large opening through which connections with electronics can be made. Electronics can be located inside of the shroud member to protect them from moisture, contaminants and potting stress. The resulting flexibility in the electronics compartment provides increased modularity allowing efficient design and production.

Figure 1:
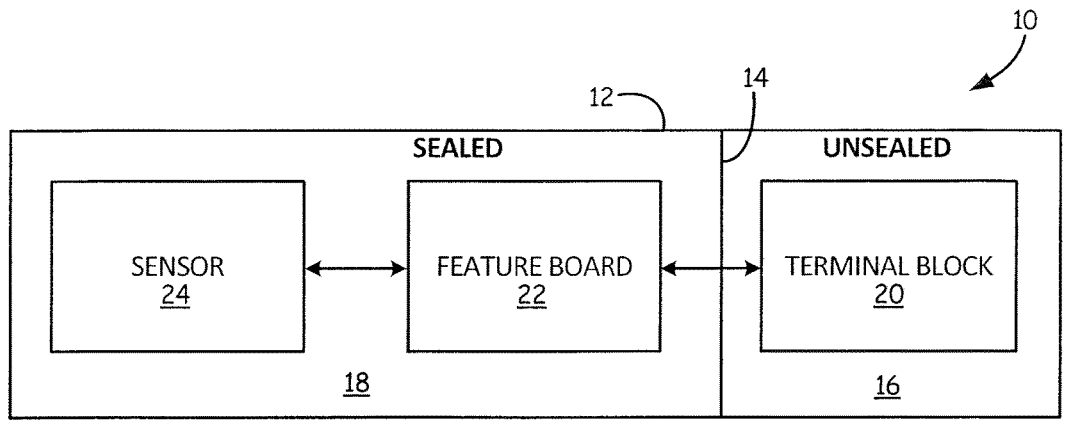
FIG. 1 is a simplified block diagram of a prior art process variable transmitter having a housing with two cavities formed therein.

One configuration of a typical process variable transmitter provides two compartments. One compartment carries the terminal block (an unsealed side) and the other compartment houses the electronics in a sealed environment. Such a configuration of a process variable transmitter 10 as illustrated in FIG. 1 in which a housing 12 includes a barrier 14 forming an unsealed compartment 16 and a sealed compartment 18. The unsealed compartment carries the terminal block 20 and the sealed compartment carries a feature board (i.e., measurement circuitry, etc.) 22 along with a process variable sensor 24. Although the terminal block compartment 16 may be sealed by a housing cover, it may still be exposed to the outside environment through a conduit which carries wires or other attachments to the housings. Water condensation and other contaminants can also accumulate in the terminal block compartment 16.

In one prior art configuration, threaded feed-through RFI filters are used to provide an electrical connection through the barrier 14. Another configuration uses a seal board along with seal cones. The terminal block 20 is encapsulated in potting material ("potted") to protect the electronic components from contaminants and moisture. This limits the type of component may be used on the terminal block 20 because they must be physically robust due to the mechanical effects of potting. As a result, the terminal block 16 is typically just a pass through device. Functionality of the transmitter may be changed by changing the terminal block 20 and/or feature board 22.

The various configurations discussed above including using RFI filters, potting compounds, seal cones, rubber boots, etc., can be expensive and difficult to manufacture. The potting process is messy and labor intensive and may potentially lead to high variability and a long entrapment time. Further, the potting compound may damage components or break them off from the circuit board when the temperature goes from one extreme to another. The threaded feed-through RFI filters are sensitive to cracking during installation if not carefully installed.

Figure 2:
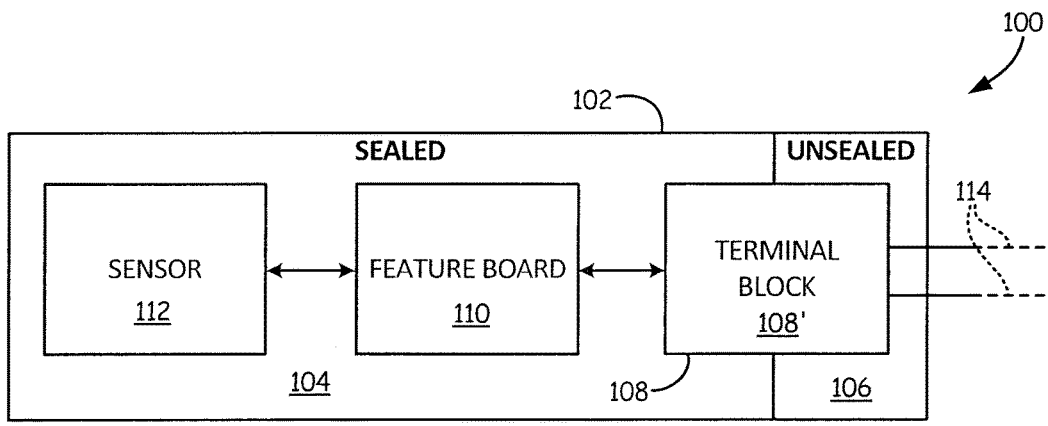
FIG. 2 is a simplified block diagram of a process variable transmitter including a cavity formed in a terminal block in accordance with one example embodiment.

FIG. 2 is a simplified block diagram of a process variable transmitter 100 having a cavity formed therein which is divided into a first (electronics) sealed cavity 104 and a second (terminal block) unsealed cavity 106. In the configuration of FIG. 2, a terminal block 108 creates a sealed compartment 108' within the terminal block 108. The terminal block connects to a feature board 110 and a process variable sensor 112. The sealed compartment 108' of terminal block 108 is preferably fabricated as a single assembly which reduces costs and component complexity.

FIG. 2 also illustrates an exemplary two-wire process control loop 114 which electrically connects to terminal block 108. The two-wire process control loop may be in accordance with industry standards and is used for transmitting information related to a sensed process variable by the process variable transmitter 100 as well as receiving power to power circuitry of the process variable transmitter 100. One such communication standard is the HART® standard in which an analog current level is used to represent a process variable. A digital signal may also be modulated on top of the analog current level to transmit additional information. The two wire process control loop can also be used for sending information to the process variable transmitter 100. Other types of process control loops may also be used including those in accordance with a Fieldbus standard. Further, the process control loop 114 may be a wireless process control loop in which information is communicated wirelessly. One such wireless communication protocol is the WirelessHART® communication protocol in accordance with IEC 62591. The terminal block 108 is not limited to these types of connection and may include other types of electrical connections or components. Examples include a MORBUS serial protocol connection or other types of connections for providing power and communications, in both analog and digital formats. Sensors may also be included in the terminal block 108 such as a temperature sensor, for example, an RTD or thermocouple. Such temperature sensors can be used in devices which are used to sense temperature as well as devices used to measure pressure. Other types of sensors may also be included.

Figure 3:
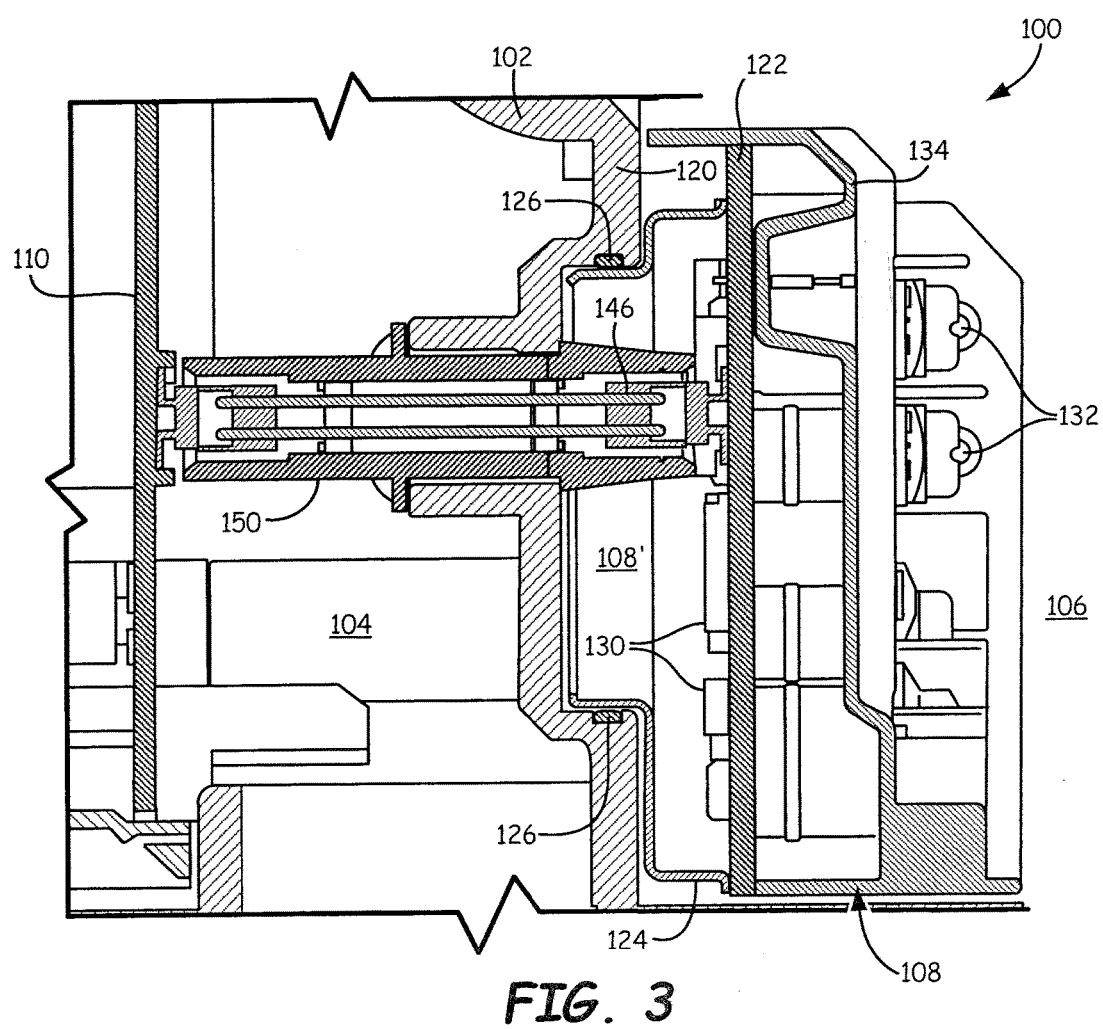
FIG. 3 is a side cross-sectional view of a portion of the process variable transmitter of FIG. 2 showing the terminal block sealed to a barrier in a housing of the process variable transmitter.

FIG. 3 is an enlarged cross-sectional view of a portion of process variable transmitter 100 in accordance with one example configuration. As illustrated in FIG. 3, a barrier 120 divides the internal cavity of housing 102 into a sealed electronics cavity 104 and an unsealed terminal block cavity 106. The terminal block 108 includes a sealed electric circuit board 122 bonded to a shroud member 124. The shroud member is preferably formed as a metal cup in this embodiment. The metal cup 124 is sealed to the housing 102 at the barrier 120 by an O-ring seal 126. Circuit board 122 can be sealed to metal cup 124 through any appropriate sealing technique including a seal formed by soldering. In this configuration, optional electrical components 130 carried on circuit board 122 are contained in sealed cavity 108' of the terminal block 108. A connector mounting assembly 134 is mounted on the circuit board 122 and carries electrical connectors 132. The mounting assembly 134 may be fabricated, for example, of a plastic or the like. Electrical connectors 132 as illustrated as screw terminals, however, any type of connector may be employed. Typically, these connectors 132 are used for connecting to components which are external to the process variable transmitter such as to process control loop 114. A connector assembly 150 electrically connects circuit board 122 to feature board 110.

Figure 4A:
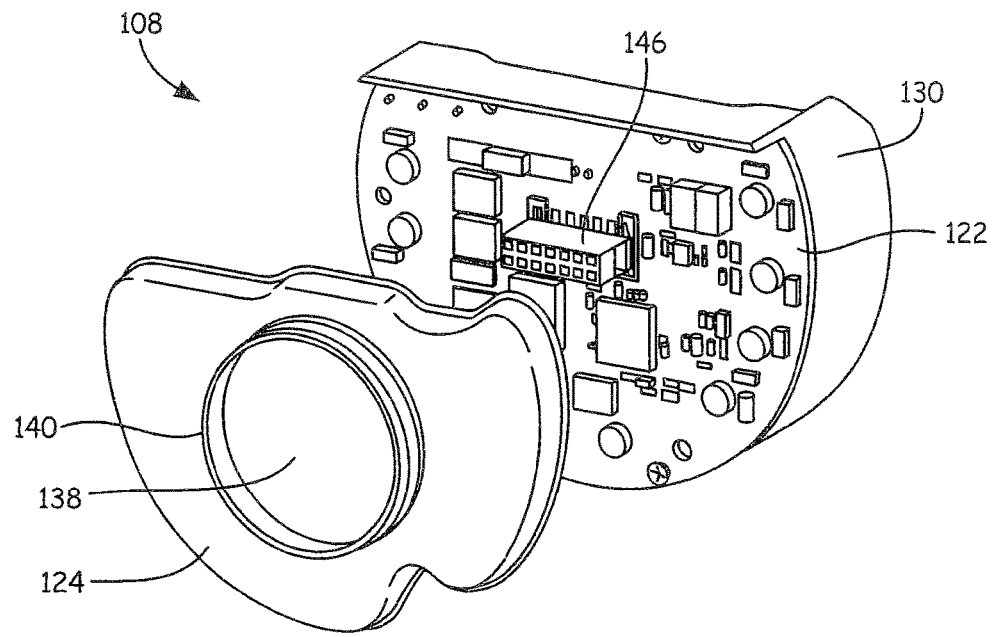
FIG. 4A is an exploded view and FIG. 4B is an assembled view of the terminal block of FIG. 2 showing a metal cup.
Figure 4B:
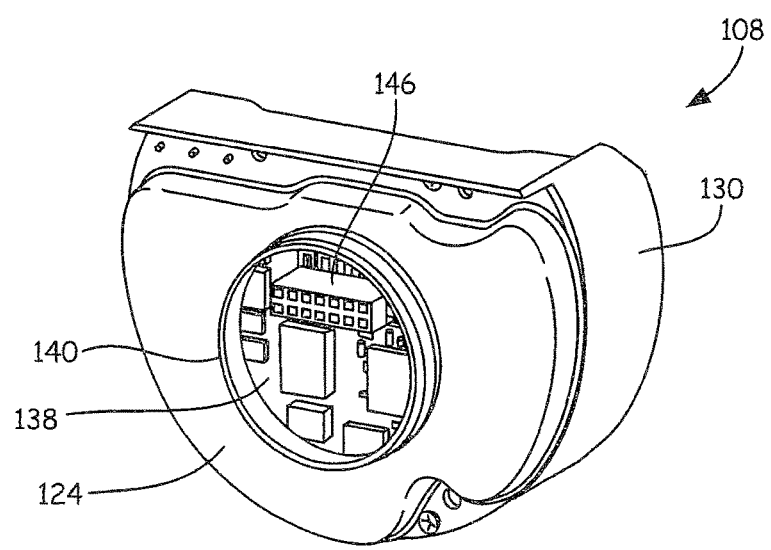

FIG. 4A is an exploded view and FIG. 4B is an assembled view of the terminal block 108 according to one embodiment. As illustrated in FIGS. 4A and 4B, the metal cup 124 includes an aperture or opening 138 formed therein. The aperture 138 includes a lip 140 which seals against O-ring 126 shown in FIG. 3. An electrical plug 146 is carried on the circuit board 122 and accessible through aperture 138. Referring back to FIG. 3, an electrical connector assembly 150 extends through the barrier 120 and carries electrical conductors which connect to conductors in plug 146.

Figure 5A:
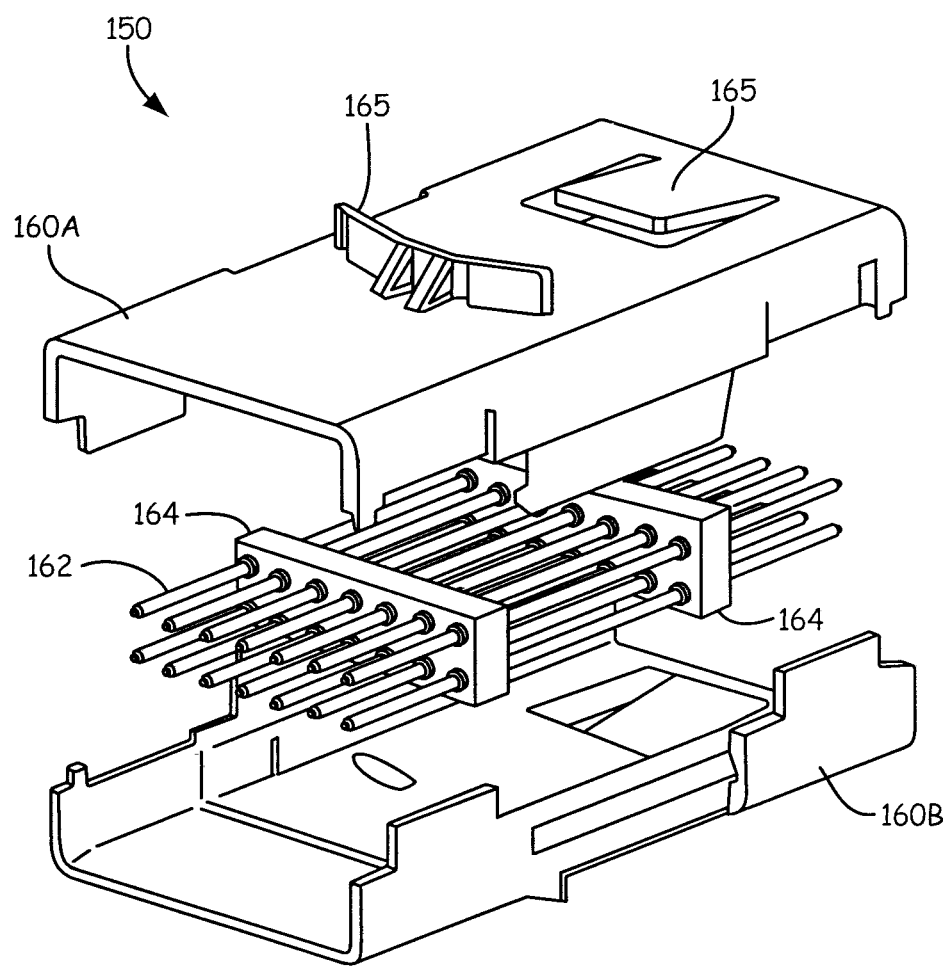
FIG. 5A is an exploded and FIG. 5B is an assembled view of an electrical connector assembly which extends through the barrier of FIG. 2.
Figure 5B:
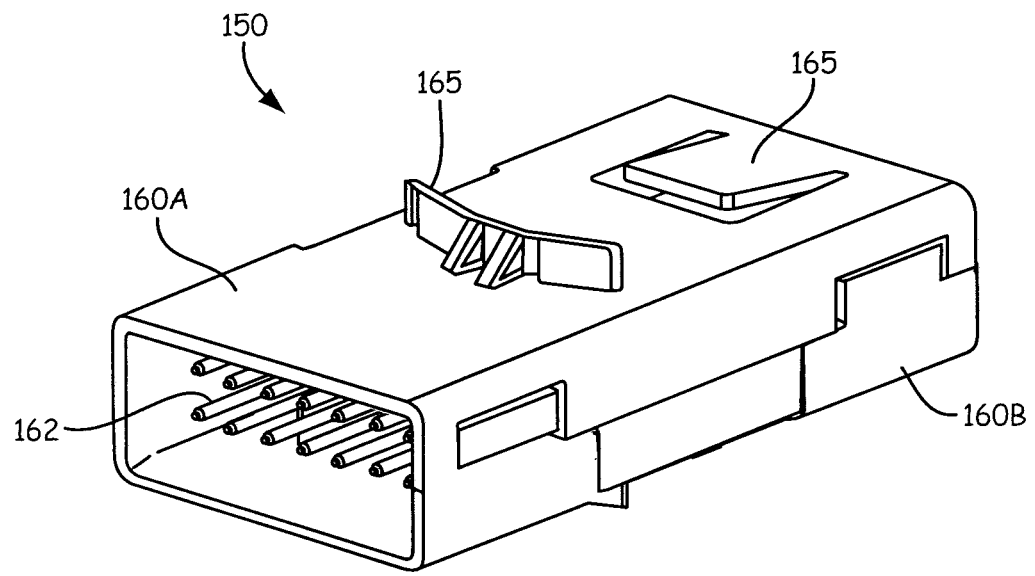

FIG. 5A is an exploded view and FIG. 5B is an assembled view of electrical connector assembly 150 according to one embodiment. Assembly 150 includes a housing formed by housing portions 160A and 160B which carry a plurality of pin conductors 162 therein. Housing portions 160A,B can be configured to assemble through a snap locking mechanism or, may be bonded, or some other attachment technique may be employed. In this embodiment, locking features 165 are carried on the housing 160A,B and operate to lock the connector assembly 150 into the barrier 120 show in in FIG. 3. Pin conductors 162 are held in place relative to each other by supports 164. This configuration allows the conductors to "float" with respect to the housing 160A,B and the barrier 120 thereby allowing some tolerance for misalignment with respect to connector assembly 150. The pin conductors 162 provide an electrical connection between the feature board 110 and the circuit board 122 of the terminal block 108 input, as illustrated in FIG. 3. The electrical connection may be any type of electrical connection. Examples include a process control loop output such as a 4-20 mA signal which may also carry digital information. An optional power connection or optional communication between the two boards may also be provided. Other electrical connections between components may be provided. Further, spare or unused electrical pins may also be included.

Figure 6A:
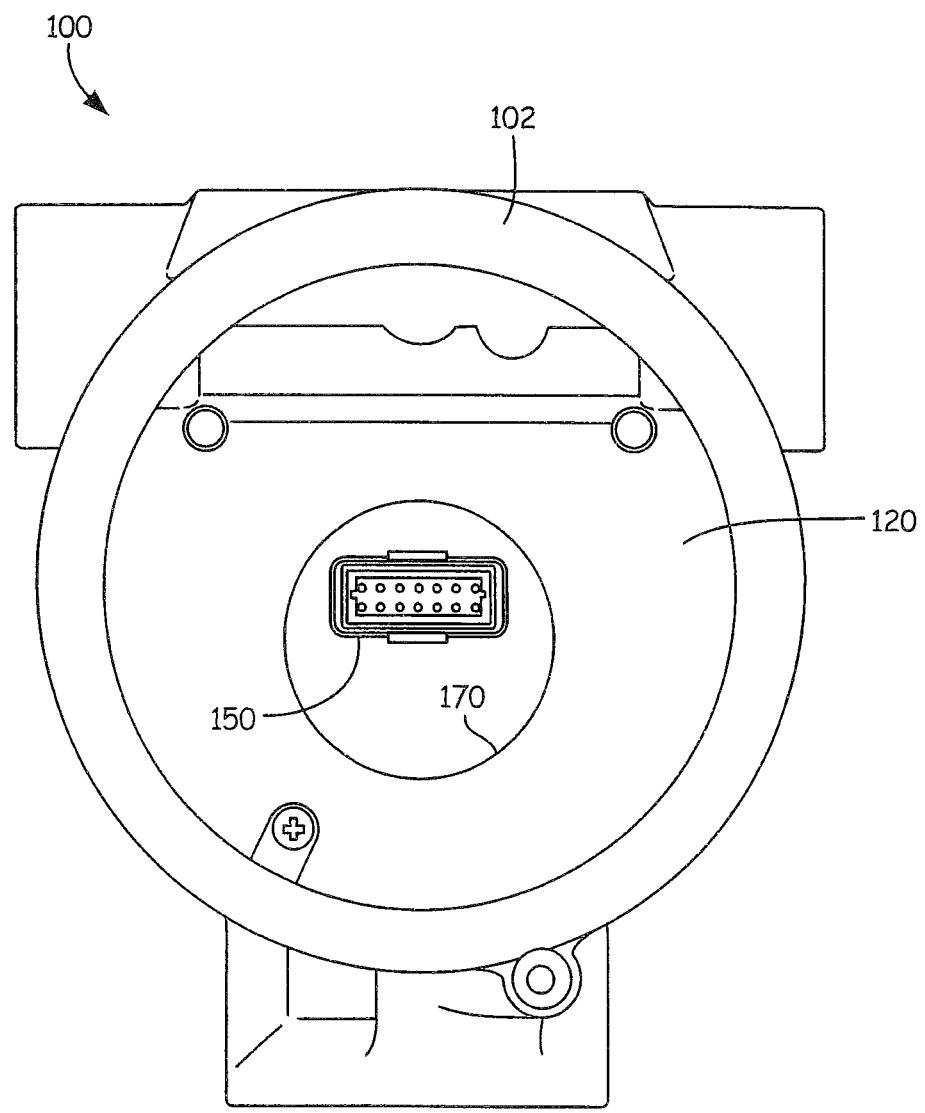
FIG. 6A is a front plan view and FIG. 6B is a side cross-sectional perspective view showing the connector assembly mounted in the barrier of the transmitter housing.
Figure 6B:
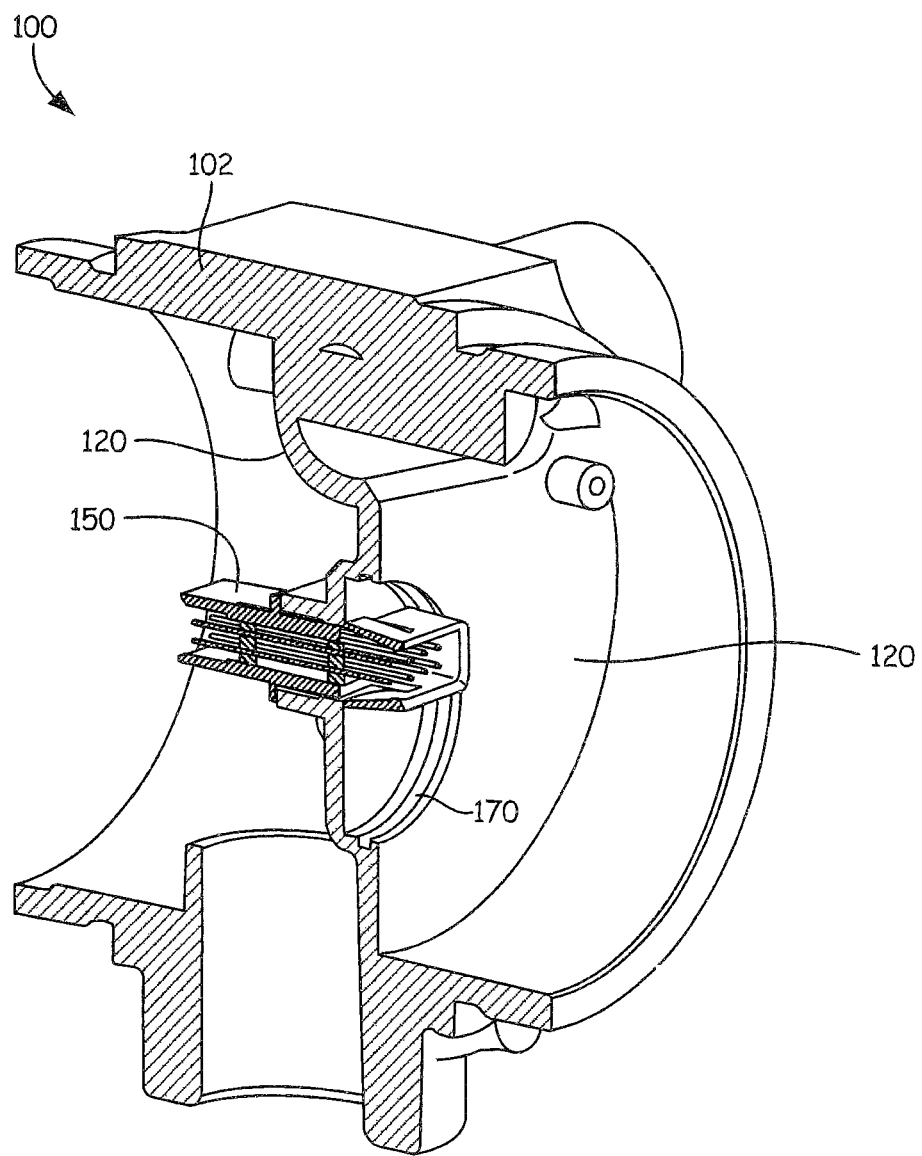
Figure 6C:
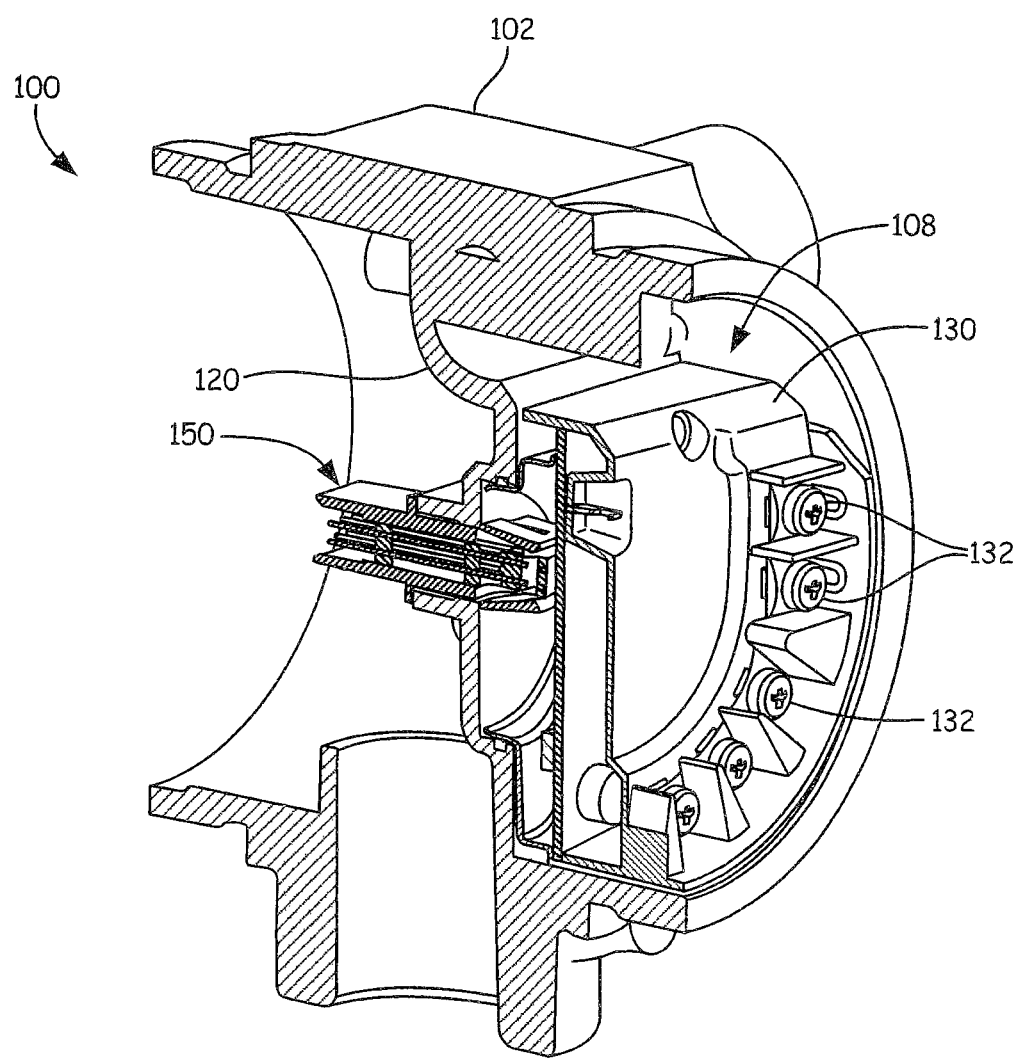
FIG. 6C is a side cross-sectional view showing the terminal block mounted to the barrier and electrically connected to the electrical connector assembly.

FIG. 6A is a front plan view and FIG. 6B is a side cross-sectional perspective view of process variable transmitter 100 showing the electrical connector assembly 150 mounted in the barrier 120. FIGS. 6A and 6B also illustrate a circular recess 170 which carries O-ring 126 (shown in FIG. 3) and is configured to receive lip 140 illustrated in FIGS. 4A and 4B. FIG. 6C is a side cross-sectional view of process variable transmitter 100 showing the terminal block 108 mounted in housing 102 and sealed to the barrier 120 of housing 102.

In the embodiment discussed above, the metal shroud (cup) 124 illustrated in FIGS. 4A, B can be soldered to the circuit board 122 thereby replacing the potting material used in prior art configurations. This protects the electronic components from moisture and contaminants present on the "unsealed side" of the barrier in the transmitter housing. The electrical connection through the barrier 120 can be a standardized socket and pin configuration. RFI filtering can be performed, for example, using circuit components 130 carried on the circuit board 122 of the terminal block 108. The pins that are used for the electrical connections are contained in a cartridge 150 that snaps into the barrier portion of electronics housing 102. The cartridge can be easily replaced in the field if the pins are damaged and is designed to allow the pins to "float" thereby allowing for large misalignments without placing excessive stress on the electrical connectors. When the terminal block 108 is inserted into the housing 102, it is sealed by the O-ring seal 126 illustrated in FIG. 3 and conductor pins 162 make electrical contact with connector assembly 146 carried on the circuit board 122 of terminal block 108. Through the O-ring seal to the rim of aperture 138, the interior of the metal shroud becomes an extension of the sealed side 104 of the housing 102. This increases the number of options that are available to make electrical connections to components and also decreases manufacturing costs. As potting material is no longer required, more complex and/or more sophisticated circuits may be carried on the terminal block 108 using components which could be damaged by potting material.

Figure 7:
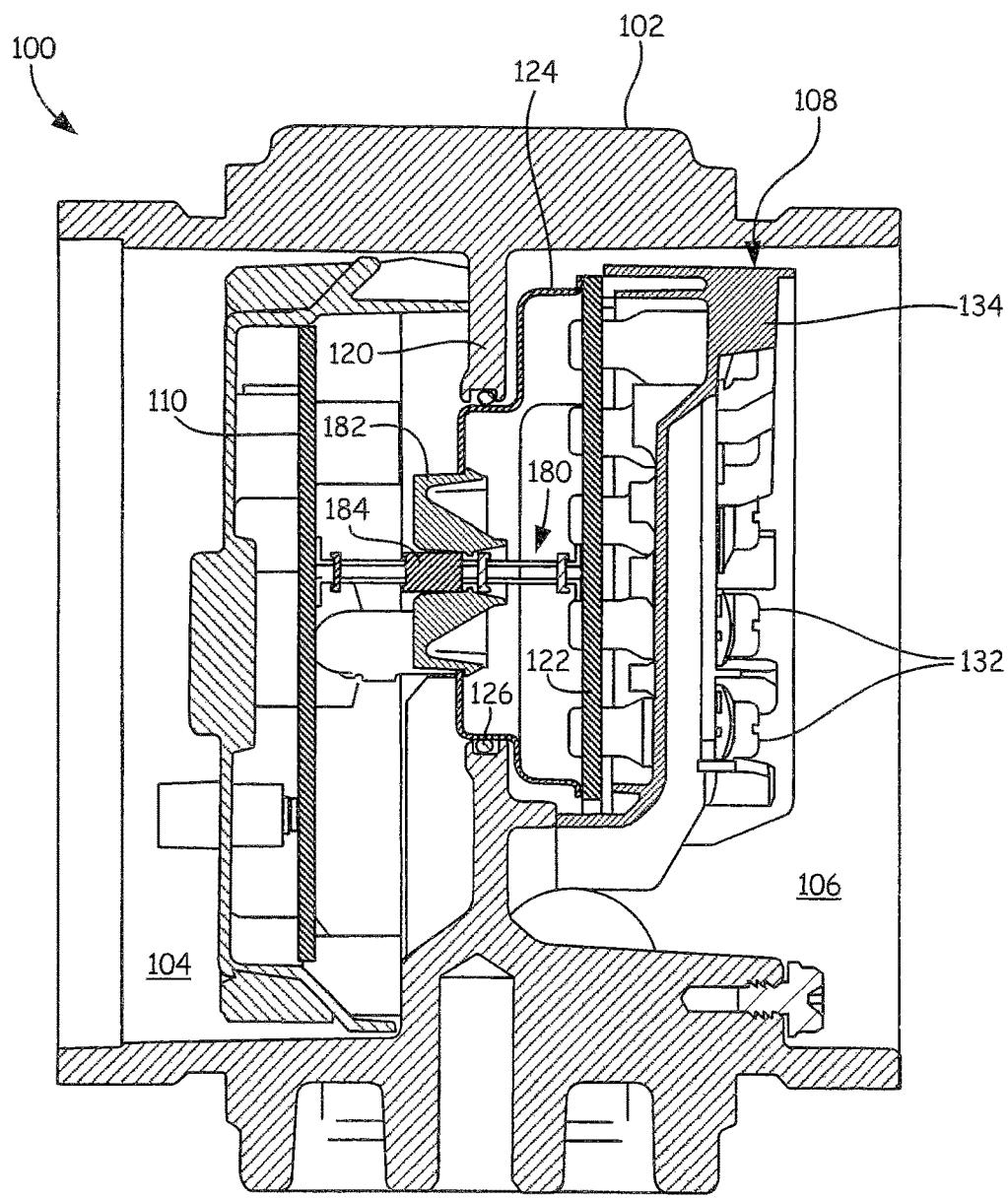
FIG. 7 is a side cross-sectional view of a process variable transmitter and FIG. 8 is a perspective cross-sectional view of a terminal block in accordance with another example embodiment.
Figure 8:
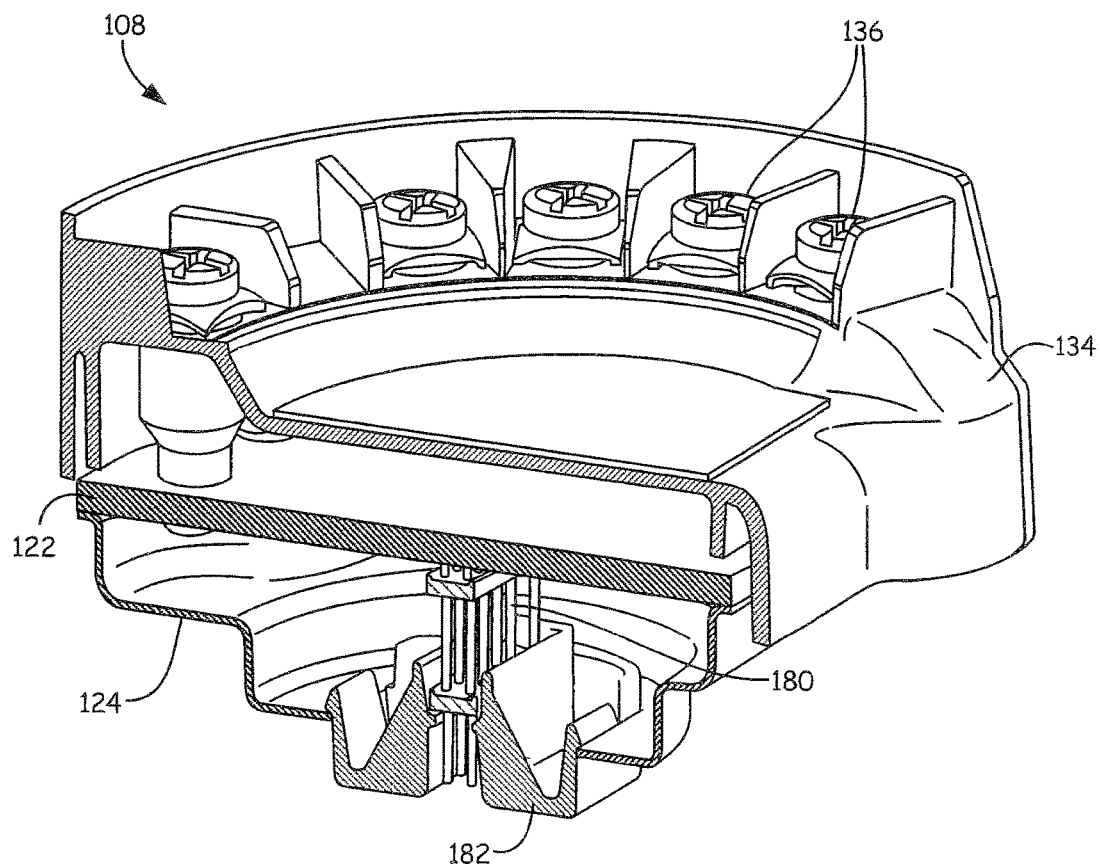

FIG. 7 is a side cross-sectional view of process variable transmitter 100 and FIG. 8 is a perspective cross-sectional view of terminal block 108 showing another example embodiment. In FIGS. 7 and 8, the numbering of similar components previously discussed have been maintained. In the configuration of FIG. 7, the barrier 120 in the housing 102 includes an aperture which receives the shroud member or metal cup 124 of the terminal block 108. In this configuration, the O-ring 126 provides a seal between the compartments or cavities 104, 106 of the housing 102. An integral pin alignment method is employed in which electrical conductors 180 are electrically connected to the circuit board 122 of terminal block 108 and held in place with respect to the metal cup 124 by a mount 182. The electrical conductors 180 plug into a connector plug 184 mounted to the feature board 110.

The configurations shown herein provide an increased modularity between the various circuits used in a process variable transmitter. For example, circuits associated with the terminals may be located in close proximity to the terminals on the circuit board 122 of terminal block 108. Optional features can be added to a process variable transmitter by simply swapping out a terminal block 108 as desired. Example terminal block options include a base option with no additional features, a configuration in which temperature measurement circuitry is provided, a configuration in which communication circuitry is provided, etc. In one configuration, the terminal block 108 carries all of the electronic circuitry used to interface with the process variable sensor 112 shown in FIG. 2 thereby eliminating the feature board 110.

In various configurations, a sealed electronics compartment is provided in a terminal block assembly which protects sensitive electronics operated in the unsealed terminal compartment. The sealed electronic compartment includes a circuit board to separate the terminal side (unsealed side) from the electronic components (sealed side) along with a metal shroud or "cup" attached to the circuit board to provide the sealed compartment for the electronics when the terminal block is mounted against the barrier of the housing. The metal shroud can be formed using an alloy which can be easily soldered or metal plated with a solderable coating or made from a clad or bonded material with a solderable surface thereon. The sealed electronic compartment includes a seal between the metal shroud and the electronic housing to allow electrical connections to pass to the sealed side of the housing. The seal between the metal shroud and the electronic housing can be provided using any appropriate technique such as the radial O-ring discussed herein. The seal should preferably maintain its sealing ability over time and exposure to extreme environments. This configuration eliminates additional components used for compartment seals such as a seal board, threaded RFI filters, soldered filter tubs and/or ceiling boots thereby reducing costs. In some configurations, the metal cup includes a sufficiently large opening to accommodate different types of connections including multiple pins, cables, flex circuits, etc., while still maintaining an environmental seal. The opening allows for standard connectors to provide a compact configuration with a large number of electrical conductors. With the sealed compartment in the terminal block, the protected enclosure allows for auxiliary functions to be added to the device and connected to the main electronics through the defined interface. Further, using a defined interface allows product options to be provided by substituting different terminal blocks with different auxiliary functions, to create a more configurable device. The pin cartridge which provides the electrical connection to the terminal block 108 may be replaceable to provide different functionality in a limited space. In one embodiment, the pin cartridge allows the "pin stack" of electrical conductors to float thereby allowing for misalignment between the connectors without putting stress on the connectors or other components. A connector alignment feature can be provided that is made into the terminal block assembly and connects directly to the feature board. Such a connector alignment feature may be configured to provide a free floating header assembly to allow for some misalignment between components. The cup or shroud 124 discussed herein may be fabricated of any material including a metalized polymer.

Although the present invention has been described with reference to preferred embodiments, workers skilled in the art will recognize that changes may be made in form and detail without departing from the spirit and scope of the invention. Although FIG. 2 shows a sensor 112, in some configurations the sensor 112 is optional. The sensor 112 may be any type of process variable sensor including a pressure sensor, temperature sensor, etc. The connection 114 illustrated in FIG. 2 may also comprise a connection to an external sensor such as an external temperature sensor, pressure sensor or other process variable sensor. The external sensor may be used in conjunction with the optional sensor 112. For example, a single external temperature sensor may be used to sense an external temperature. In a pressure sensing system, an external pressure sensor may be employed to obtain a temperature of a process fluid, for example, for use in the determination of mass flow or simply to provide a secondary process variable. An external pressure sensor may be employed in an electronic remote seal configuration or the like, in such a configuration, a remote pressure may be sensed for use, for example, the determination of level of a process fluid in a tank or other container. The communication signal carried through the electrical connection between the terminal block and the feature board may be an internal communication, for example, between circuits within the process variable transmitter such as using UART, I2C as well as process communication, for example, in accordance with the Hart® protocol.

What is claimed is:

1. A process variable transmitter for use in an industrial process, comprising:
a housing having a cavity formed therein, the housing including a barrier which divides the cavity into first and second cavities;
measurement circuitry in the first cavity configured to measure a process variable of the industrial process; and
a terminal block assembly in the second cavity, the terminal block assembly forming a seal with the housing thereby forming a third cavity between the barrier and a circuit board of the terminal block assembly, the terminal block assembly including a shroud member arranged to define the third cavity, wherein the third cavity formed between the barrier and the circuit board forms a compartment sealed from exposure to an environment in the second cavity.

2. The process variable transmitter of claim 1 wherein the shroud member comprises a metal shroud.

3. The process variable transmitter of claim 1 including a seal between the shroud member and the housing of the process variable transmitter.

4. The process variable transmitter of claim 3 wherein the seal comprises an O-ring.

5. The process variable transmitter of claim 1 wherein the circuit board carries at least one circuit component in the third cavity.

6. The process variable transmitter of claim 1 wherein the terminal block assembly includes a plurality of terminals for coupling to a two-wire process control loop.

7. The process variable transmitter of claim 1 wherein the process control loop is used to provide power to power the process variable transmitter.

8. The process variable transmitter of claim 1 including electrical conductors at least partially disposed within the barrier and extending into the third cavity to electrically connect the circuit board to the measurement circuitry.

9. The process variable transmitter of claim 8 wherein the shroud member includes an aperture formed therein wherein the electrical conductors extend through the aperature.

10. The process variable transmitter of claim 8 wherein the conductors carry power.

11. The process variable transmitter of claim 8 wherein the conductors carry a communication signal.

12. The process variable transmitter of claim 11 wherein the communication signal is in accordance with a two-wire process control loop communication standard.

13. The process variable transmitter of claim 11 wherein the communication signal is for use in communicating between components of the process variable transmitter.

14. The process variable transmitter of claim 8 wherein the conductors are arranged to compensate for misalignment.

15. The process variable transmitter of claim 14 wherein the misalignment occurs in a connection between the circuit board and the measurement circuitry.

16. The process variable transmitter of claim 8 wherein the connectors are mounted to the barrier.

17. The process variable transmitter of claim 8 wherein the connectors are mounted to the terminal block assembly.

18. The process variable transmitter of claim 17 wherein the circuit board includes a temperature sensor for use in compensating measurements.

19. The process variable transmitter of claim 1 wherein the barrier includes an opening and the terminal block is sealed against the opening.

20. The process variable transmitter of claim 1 wherein the circuit board carries a temperature sensor.

21. The process variable transmitter of claim 1 wherein the circuit board carries communication circuitry.

22. The process variable transmitter of claim 2 wherein the shroud member is soldered to the circuit board.

23. The process variable transmitter of claim 1 including at least one electrical connection between the circuit board and the measurement circuitry.

24. The process variable transmitter of claim 23 wherein the at least one electrical connection extends through the barrier.

25. The process variable transmitter of claim 1 wherein the terminal block includes an alignment feature for alignment with the housing.

26. The process variable transmitter of claim 1 including first and second end caps configured to enclose the respective first and second cavities of the housing.

27. The process variable transmitter of claim 1 including a process variable sensor coupled to the measurement circuitry for use in measuring the process variable.

28. The process variable transmitter of claim 1 wherein the circuit board carries temperature measurement circuitry configured to couple to an external temperature sensor.

* * * * *